US006967867B2

(12) United States Patent
Hamaguchi (10) Patent No.: US 6,967,867 B2
(45) Date of Patent: Nov. 22, 2005

(54) SEMICONDUCTOR MEMORY DEVICE AND METHOD FOR CORRECTING MEMORY CELL DATA (75) Inventor: Koji Hamaguchi, Tenri (JP)

(73) Assignee: Sharp Kabushiki Kaisha, Abeno-ku (JP)

( * ) Notice: Subject to any disclaimer, the term of this patent is extended or adjusted under 35 U.S.C. 154(b) by 0 days.

(21) Appl. No.: 10/729,334

(22) Filed: Dec. 5, 2003

(65) Prior Publication Data

US 2004/0114427 A1    Jun. 17, 2004

(30) Foreign Application Priority Data

Dec. 5, 2002 (JP) .............................. 2002-353731

(51) Int. Cl.[7] .......................................... G11C 16/04
(52) U.S. Cl. .............................. 365/185.03; 365/185.22
(58) Field of Search ........................ 365/158.03, 185.22, 365/185.03, 185.21, 158

(56) References Cited

U.S. PATENT DOCUMENTS 5,835,413 A    11/1998  Hurter et al.
5,966,322 A  * 10/1999  Pohm et al. ................. 365/158

* cited by examiner

*Primary Examiner*—Thong Q. Le
(74) *Attorney, Agent, or Firm*—Morrison & Foerster LLP (57) ABSTRACT

A semiconductor memory device comprises a plurality of memory cells, each of which is capable of storing N-level data and being reprogrammed; and a plurality of monitor cells that separately store individual data values of the N-level data by using the same scheme as that used for the memory cells. Sensing means senses whether a physical quantity of the monitor cell which corresponds to the data value stored in the monitor cell is within a preset range; verification means verifies whether the physical quantity of the memory cell which corresponds to the data value stored in the memory cell is within the preset range when the sensing means has sensed that the physical quantity of the monitor cell is out of the preset range; correction means corrects the physical quantity. Consequently, a physical quantity variation can be efficiently detected without overstressing memory cells, and correction can be implemented for not only a downward variation due to charge loss and/or the like but also a variation in an upward physical quantity variation due to charge gain and/or the like in a specified range.

16 Claims, 9 Drawing Sheets

SEMICONDUCTOR MEMORY DEVICE AND METHOD FOR CORRECTING MEMORY CELL DATA

BACKGROUND OF THE INVENTION

1. Field of the Invention

The present invention relates to a semiconductor memory device and a method for correcting data stored in memory cells.

2. Description of the Related Art

Conventionally, in flash memories, which is known as electrically programmable and erasable nonvolatile memories, problems can occur in which a charge state, which is one factor representing a physical quantity corresponding to data to be stored into individual memory cells, is varied by stresses. The stresses can occur because of, for example, electric current/voltage during time transition and/or in the events of a data read and the like, whereby threshold distributions of the individual memory cells deviates from a specified range. This leads to potential problems of causing, for example, delays in access time and read errors. To overcome these problems, U.S. Pat. No. 5,835,413 proposes a technique for performing data correction for a memory cell with a threshold distribution that has been deviated by stresses as described above from a specified range so that the cell is set to be within an original specified range.

Figure 7:
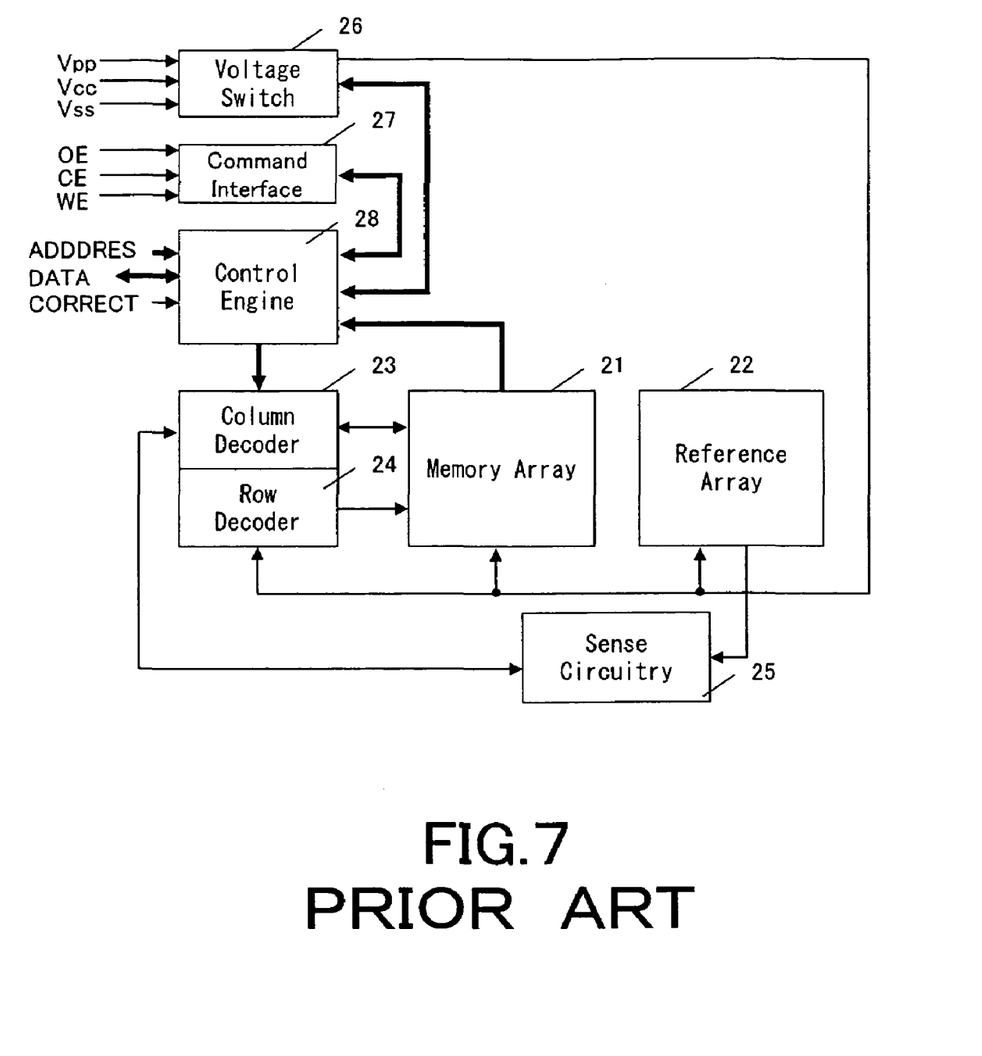
FIG. 7 is a circuit block configuration diagram of a semiconductor memory device according to a conventional art.

Referring now to the U.S. Pat. No. 5,835,413, the data correction for a NOR flash memory will be described hereinbelow. As shown in FIG. 7, the flash memory is configured to include, for example, a memory array 21, a reference array 22, a row decoder 24, a column decoder 23, a voltage switch 26, a command interface 27, and a control engine 28. The memory array 21 has memory cells arranged in a matrix. The reference array 22 contains stored reference data input to one end of a sense circuit 25. The row decoder 24 outputs word line selection signals that individually select word lines, and the column decoder 23 outputs bit-line selection signals that individually select bit lines. The voltage switch 26 has a function of switching among voltages for supply to individual circuits corresponding to individual modes such as program, erase, and read modes, and concurrently has a function of switching among intra-device boosted voltages and among externally supplied high voltages for supply to the circuits. The command interface 27 recognizes commands (individually allocated to operations such as program, erase, and read operations), and outputs signals to the individual circuits so that the device commences the individual operations corresponding to the commands. The control engine 28 serves as a microcontroller for executing a specific algorithm for, for example, executing a program or erase operation as and when the algorithm is necessary.

Basic operations of the individual circuits of the conventional memory are similar to those of an ordinary flash memory. The circuits of the conventional memory have features in that a correction signal CORRECT is input to the control engine 28. Upon input of the correction signal, the memory starts a threshold correction routine for memory cells. The signal is input with a command or the like that has been input through an external source. The proposed memory performs verification and program operations by way of internal operations. From this viewpoint, the proposed memory is similar to an ordinary NOR flash memory with only exceptions being that the proposed memory has additional functions of applying the correction signal CORRECT and the threshold correction routine.

Figure 8:
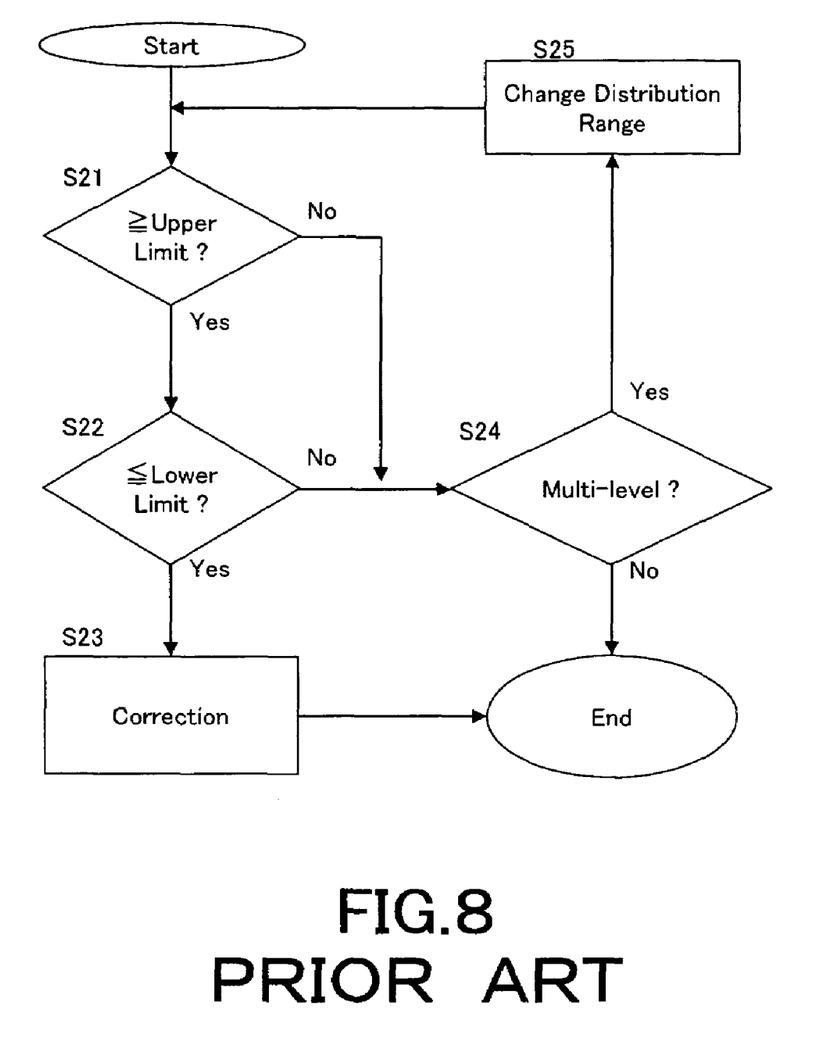
FIG. 8 is an explanatory flowchart of the correction method for correcting data stored in memory cells according to the conventional art.
Figure 9:
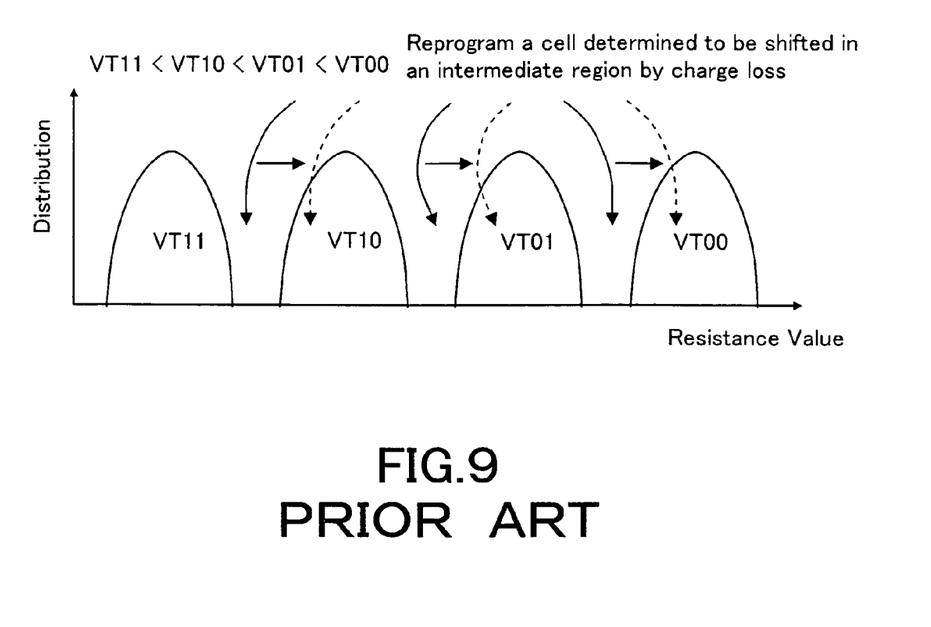
FIG. 9 is an explanatory view depicting threshold distributions of individual memory cells of the semiconductor memory device according to the conventional art.

The threshold correction routine will be described hereinbelow with reference to FIGS. 8 and 9. FIG. 9 shows threshold distributions of memory cells, in which the threshold is highest at VT00 and is lowest at VT11. The routine will be described with reference to an example case in which when memory cells required to be within the range of VT01 has caused charge loss and has thereby been shifted to an intermediate state between VT01 and VT10, the threshold is corrected to VT01.

In response to an operation such as input of a command, the routine inputs a correction signal CORRECT to the control engine, and commences a threshold correction operation of the memory cell of interest. First, at step S21, the routine determines whether the state of the memory cell is higher than an upper limit of a distribution range. In more detail, the sense circuit 25 performs a comparison between the memory cell and a reference cell indicative of an upper limit of VT11 to verify whether the state of the memory cell is in an intermediate region between VT11 and VT10. In the present example, the threshold of the memory cell is relatively high, the routine proceeds to step S22 to determine whether the threshold of the memory cell is lower than a lower limit of a distribution range next higher than the first distribution range. In specific, the routine performs a comparison between the state of the memory cell and a reference cell indicative of a lower limit of VT10. In the present example, the threshold of the memory cell is determined higher than the lower limit, so that the routine goes on to step S24 that determines whether the state of the memory cell is in a different state of a multi-valued memory. In more detail, at step S24 the routine determines whether a different distribution range is present. In the present example, since the different distribution range is present, the algorithm proceeds to step S25 that alters the to-be-verified distribution range. (According to the algorithm, while the verification needs to be performed when the memory is a multi-valued memory, the verification need not be performed when the memory is a 2-bit valued memory. As such, when the memory is determined to be a 2-bit valued memory, the routine terminates upon having reached the step S24.) Subsequently, the routine goes again to step S21 that verifies whether the state of the memory cell lies in an intermediate region between VT10 and VT01. That is, the routine performs a comparison between the memory cell and a reference cell indicative of an upper limit of VT10. In the present example, since the threshold of the memory cell is higher than the upper limit, the routine proceeds to step S22 and performs a comparison between the threshold of the memory cell and a reference cell indicative of a lower limit of the VT01. In the present example, since the threshold of the memory cell is lower than the lower limit, the routine goes to step S23 that programs the memory cell until the memory cell reaches a state higher than a lower limit of a next higher distribution range of the current distribution range. That is, at step S23 the memory cell is programmed until the state of the memory cell reaches the lower limit of VT01. Upon completion of the programming, the algorithm terminates. Then, the address is reset and the steps of the routine described above are repeatedly executed, whereby all the memory cells individually undergo the verifications. During the verifications, upon sensing of a memory cell in a state lying outside of the original specified range, the state of the cell is corrected to be within the original range. As above, the routine has been described with reference to the example case where the memory cell is in the intermediate state. However, for a memory cell in a normal state, the routine terminates upon completion of the operation at step S24; that is, programming is not executed.

Thus, according to the conventional technique, the verifications need to be performed for all the individual memory cells to verify data retention states thereof. This gives rise to problems such as that it takes a time for the processing, the shift of threshold due to variations in the charge amount which is one factor representing the physical quantity cannot be sensed in an early stage, and in addition, reduction in power consumption cannot be implemented. In addition, each time a threshold shift is sensed, stresses are imposed on the memory cell, thereby increasing the probability of shifting the threshold of the cell to be out of the specified range. Further, while the conventional technique requires a command or the like to be externally input to commence the algorithm; that is, unless otherwise such a command is input, the algorithm is not executed. This gives rise to a problem of reducing device reliability. Furthermore, in a flash memory, although the conventional technique is capable of performing program operations in units of one bit to a memory cell shifted from a distribution range due to charge loss, erases can only be performed in units of a block (group of memory cells designated to be erased). This gives rise to another problem in that correction cannot be performed in units of a bit for a memory cell shifted from a threshold distribution range by the charge gain.

SUMMARY OF THE INVENTION

The present invention is made in view of the problems described above. An object of the invention is to provide a semiconductor memory device in which a physical quantity variation can be efficiently sensed without overstressing memory cells, and correction can be implemented for not only a downward variation due to charge loss and/or the like but also a variation in an upward physical quantity variation due to charge gain and/or the like in a specified range. Another object of the invention is to provide a correction method for correcting data stored in memory cells.

In order to achieve the object described above, a semiconductor memory device according to the present invention has a feature configuration comprising a plurality of memory cells, each of which is capable of storing N-level data (N represents a natural number of 2 or greater) and being reprogrammed; a plurality of monitor cells that separately store individual data values of the N-level data by using the same scheme as that used by the memory cells; sensing means for sensing whether a physical quantity of the monitor cell which corresponds to the data value stored in the monitor cell is within a preset range; and verification means for verifying whether the physical quantity of the memory cell which corresponds to the data value stored in the memory cell is within the preset range when the sensing means has sensed that the physical quantity of the monitor cell is out of the preset range.

Thus, the plurality of monitor cells that separately store the individual data values of the N-level data by using the same scheme as that used for the memory cells. Thereby, only a variation in the physical quantity of each of the monitor cells is sensed during a normal operation, and the memory-cell verification is performed only when the physical quantity of the memory cell has shifted. Consequently, in a state where the memory cell is not overstressed, the variation in the physical quantity of the memory cell can be efficiently and early verified with high speed and low power consumption.

In this case, when the configuration includes the first monitor cells that monitors deteriorations caused in read operations for data retention states of the memory cells, a variation in the physical quantity which has been caused by stresses due to, for example, current and voltage during usage time can be detected. When the configuration includes the second monitor cells that monitors time-dependent deteriorations of the data retention states of the memory cells, a variation in the physical quantity which has been caused by stresses occurring with time transition can be detected.

The semiconductor memory device is preferably configured such that stresses influencing the deteriorations of the data retention states, which stresses occur with the read operations, on the first monitor cells are greater than the stresses on the memory cells which are monitoring targets of the first monitor cells. This configuration is preferable for the reason that with the first monitor cell being used, a variation in the physical quantity due to the stresses can be sensed in a state with sensitivity higher than that of the memory cell. In addition, the semiconductor memory device is preferably configured such that each time a read operation takes place for the first memory cell which is a monitoring target of the first monitor cell, at least one read operation is executed on the first monitor cell. This configuration is preferable for the reason that equal stresses can be exerted on the memory cells and monitor cells.

Similarly, the semiconductor memory device is preferably configured such that stresses influencing deteriorations of data retention states on the second monitor cells in state not directly receiving a read operation, a programming operation, and an erase operation is greater than the stresses on the memory cells which are monitoring targets of the second monitor cells. This configuration is preferable for the reason that with the second monitor cell being used, a variation in the physical quantity due to the stresses can be sensed in a state with sensitivity higher than that of the memory cell. In addition, the plurality of monitor cells are preferably disposed between the plurality of the memory cells, which are the monitoring targets of the second monitor cells, and load circuits that supply voltages required for the read operation to the memory cells.

Preferably, the semiconductor memory device further comprises a timing generation circuit that generates a synchronizing signal for the sensing means to execute sensing of the physical quantity of the monitor cell with a predetermined timing. In this case, by performing preliminary researches regarding the degrees of deteriorations of data retention characteristics, since sensing can be automatically implemented with a preferable timing, the reliability is even more enhanced.

The semiconductor memory device further comprises correction means for correcting the physical quantity of the memory cell to be within the preset range when the verification means has verified the physical quantity of the memory cell to be out of the preset range. Accordingly, even when the physical quantity is out of the specified range, the correction enables steady operation to be guaranteed. In more detail, the memory cell is preferably configured to comprise a selection transistor and a nonvolatile variable resistor element permitting electrical resistance to be varied by electrical stresses and retaining the varied electrical resistance even after the electrical stresses have been relieved; and in the nonvolatile variable resistor element, an oxide having a perovskite structure containing manganese between electrodes is preferably formed. In this case, since programming correction and erasure correction for the data can be implemented in units of the memory cell, even when the physical quantity has shifted to any one of the sides of the specified range, steady operation can guaranteed at all times.

In order to achieve the another object of the invention, a correction method for correcting data stored in memory cells, each of which is capable of storing N-level data (N represents a natural number of 2 or greater) and being reprogrammed is characterized in that a plurality of monitor cells that separately store individual data values of the N-level data by using the same scheme as that used by the memory cells is used; sensing is performed whether a physical quantity of the monitor cell which corresponds to the data value stored in the monitor cell is out of a preset range; a verification is performed whether the physical quantity of the memory cell which corresponds to the data value stored in the memory cell is within the preset range when the sensing means has sensed that the physical quantity of the memory cell is out of the preset range; and correction is performed for the physical quantity of the memory cell to be within the preset range when the physical quantity of the memory cell has been verified to be out of the preset range.

That is, since it is sufficient to correct the memory cell only when the physical quantity is out of the preset range, unnecessary stresses are not exerted on the memory cell, and low power consumption can be implemented.

DETAILED DESCRIPTION OF THE INVENTION

An embodiment of a semiconductor memory device of the invention will be described hereinbelow with reference to the accompanying drawings.

Figure 3:
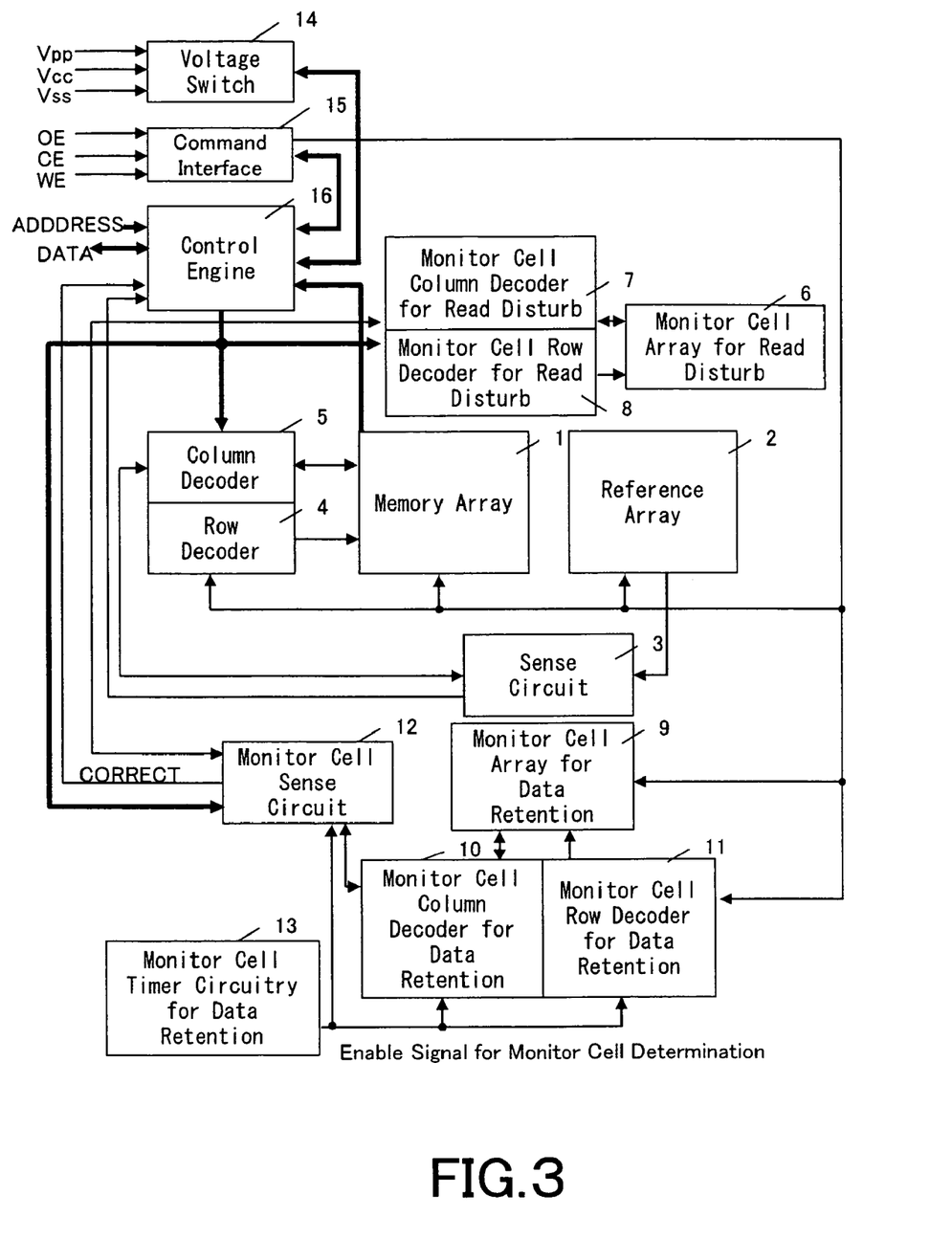
FIG. 3 is a circuit block configuration diagram of the semiconductor memory device according to the invention.

Referring to FIG. 3, the flash memory is configured to include, for example, a memory array 1, a reference array 2, a row decoder 4, a column decoder 5, a voltage switch 14, a command interface 15, and a control engine 16. The memory array 1 has a plurality of memory cells arranged in a matrix, each of which is capable of storing N-level data (N represents a natural number of 2 or greater) and being reprogrammed. The reference array 2 contains stored reference data input to one end of a sense circuit 3. The row decoder 4 outputs word line selection signals that individually select word lines, and the column decoder 5 outputs bit-line selection signals that individually select bit lines. The voltage switch 14 has a function of switching among voltages for supply to individual circuits corresponding to individual modes such as program, erase, and read modes, and concurrently has a function of switching among intra-device boosted voltages and among externally supplied high voltages for supply to the circuits. The command interface 15 recognizes commands (individually allocated to operations such as program, erase, and read operations), and outputs signals to the individual circuits so that the device commences the individual operations corresponding to the commands. The control engine 16 serves as a microcontroller for executing a specific algorithm of the type for the executing program or erase operation as and when the algorithm is necessary.

In addition, the semiconductor memory device has monitor cell arrays 6 and 9 each including a plurality of monitor cells that separately store individual data values of the of the N-value data by using the same storing scheme as that used by the memory array. Further, in the semiconductor memory device, the control engine 16; decoder circuits—namely, a read-disturbance monitor cell column decoder 7, a read-disturbance monitor cell row decoder 8, a retention monitor cell column decoder 10, and a retention monitor cell row decoder 11; and a monitor-cell sense circuit 12 are configured to function as sensing means and verification means. The sensing means directly or indirectly senses whether a physical quantity of each of the monitor cells corresponding to the data value stored into the monitor cell is within a preset range. When the sensing means has sensed that the physical quantity of the monitor cell is out of the range, the verification means verifies whether the physical quantity of the memory cell corresponding to the data value stored into the memory cell is out of the preset range. Further, the semiconductor memory device has a retention monitor cell sense timer circuit 13 embodied to work as a timing generation circuit that generates a synchronizing signal to performing sensing with a predetermined timing.

The monitor cells will be described hereinbelow in more detail. The semiconductor memory device further has a read-disturbance monitor cell array 6 and a retention monitor cell array 9. The read-disturbance monitor cell array 6 has first monitor cells arranged to monitor deteriorations caused due to read operations of the data retention states of the memory cells in accordance with differences in the causes of deteriorations of data storage/data retention characteristics. The monitor cell array 9 has second monitor cells arranged to monitor time-dependent deteriorations of the data retention states of the memory cells. The first monitor cells are read independently by the read-disturbance monitor cell column decoder 7 and the read-disturbance monitor cell row decoder 8. Similarly, the second monitor cells are read independently by the retention monitor cell column decoder 10 and the retention monitor cell row decoder 11.

The memory cells and the monitor cells, which are used in the present embodiment, are each configured of selection transistors and a nonvolatile variable resistor element. The variable resistor element permits electrical resistance, which is one factor representing the physical quantity, to be varied by electrical stresses caused by voltage application and/or the like, and retains the varied electrical resistance even after the electrical stresses have been relieved. For the nonvolatile variable resistor element, the present embodiment uses an RRAM (novel resistance control nonvolatile RAM) element. The RRAM element is formed by depositing a manganese oxide film of any one of, for example, substances represented by $Pr_{(1-x)}Ca_xMnO_3$, $La_{(1-x)}Ca_xMnO_3$, and $La_{(1-x-y)}Ca_xPb_yMnO_3$ (where, x<1, y<1, and x+y<1), of which practical examples are $Pr_{0.7}Ca_{0.3}MnO_3$, $La_{0.65}Ca_{0.35}MnO_3$, and $La_{0.65}Ca_{0.175}Pb_{0.175}MnO_3$, by using a process such as MOCVD (metal-organic chemical vapor deposition), spin coating, laser abrasion, or sputtering.

In the Specification, hereinbelow, increasing the resistance value of the RRAM element will be expressed using the word "program" and variations thereof, and decreasing the resistance value of the RRAM element will be expressed using the word "erase" and variations thereof. To perform a program operation, the selection transistor is turned on, whereby a voltage of 3V is applied to the bit line, and a voltage of 0V is applied to the source line. Conversely, to perform an erase operation, the selection transistor is turned on, whereby 0V is applied to the bit line, and 3V is applied to the source line. To perform a read operation, the selection transistor is turned on, whereby 1.5V is applied to the bit line, and 0V is applied to the source line. The individual voltage values to be applied are not limited to these values, but may be appropriately set to be suitable for the characteristics of the nonvolatile variable resistor element.

The retention monitor cell sense timer circuit 13 serves as a timing generation circuit that generates synchronizing signals used to execute sensing of the physical quantities of the individual monitor cells with a predetermined timing; and the circuit is operated upon power on and is operated also in a standby time. Specifically, the retention monitor cell sense timer circuit 13 generates clock pulses at a predetermined cycle, and outputs retention monitor cell determination enable signals. The reliability of the memory cell can be enhanced by increasing the frequency of the clock pulse generated by the retention monitor cell sense timer circuit 13. Consumption of a standby current can be reduced by lowering the frequency of the clock pulse generated by the retention monitor cell sense timer circuit 13. Suppose an event occurs for attempting to regulate the resistance-value shift due to time-dependent deterioration to be within 10 percent. In this case, the regulation of clock pulse can be implement by setting the frequency to the time at which the resistance value measured in a study/research stage is shifted 10 percent. To enhance the reliability, the frequency is preferably set to a value in the range from one-severalth to one-hundredth of the frequency. In addition, the timer circuit can be configured such that the monitor-cell sense circuit 12 is enabled at power-on. Thereby, the state of the monitor memory cell at power-on can be sensed, and the reliability can be further enhanced.

The monitor-cell sense circuit 12 identifies a retention monitor cell in synchronization with the retention monitor cell determination enable signal. Alternatively, the monitor-cell sense circuit 12 identifies a read-disturbance monitor cell in synchronization with a read signal. Thus, the monitor-cell sense circuit 12 is shared for data retention and read disturbance. To identify a retention monitor cell, the retention monitor cell column decoder 10 and the retention monitor cell row decoder 11 output a column selection signal for the retention monitor cell and a word selection signal for the retention monitor cell in synchronization with the retention monitor cell determination enable signal. Then, a retention monitor cell column selection signal and a retention monitor cell word selection signal are input to the retention monitor cell array 9. In response to the input signals, data stored in the retention monitor cell is read, and the monitor-cell sense circuit 12 determines in accordance with the read data whether the resistance value has shifted.

To determine a read-disturbance monitor cell, the read-disturbance monitor cell is always read when a memory cell of the memory array is read, and the monitor-cell sense circuit 12 determines the read-disturbance monitor cell. Specifically, in the configuration of the semiconductor memory device, a read-disturbance monitor cell is always read when a memory cell of the memory array 1 is read. In this event, a read signal for reading the memory array 1 is input to the read-disturbance monitor cell column and row decoders 7 and 8 so that the read-disturbance monitor cell becomes a cell having experiences of receiving access of the largest number of reads, and the read-disturbance monitor cell is then read in accordance with the read signal. More specifically, in the configuration, a read-operation causing stress influencing the deterioration of the data retention state for the first monitor cell is greater than the stress imposing on the monitoring-target memory cell of the first monitor cell. As such, in the configuration, each time a read operation takes place for the memory cell, which is the monitoring target of the first monitor cell, at least one read operation is executed on the first monitor cell. Data stored in the read-disturbance monitor cells need not be determined in each time the memory cell of the main array is read. The timing of the data determination may be appropriately set so that, for example, the determination is performed once every several tens to several hundreds of the reads of the memory cell of the main array.

Suppose the monitor-cell sense circuit 12 has determined a physical quantity of a retention monitor cell or a read-disturbance monitor cell, that is, a resistance value, to be shifted. In this event, the monitor-cell sense circuit 12 outputs a correction signal CORRECT to the control engine 16; and in response to the signal, the control engine 16 executes an algorithm described below.

Figure 1:
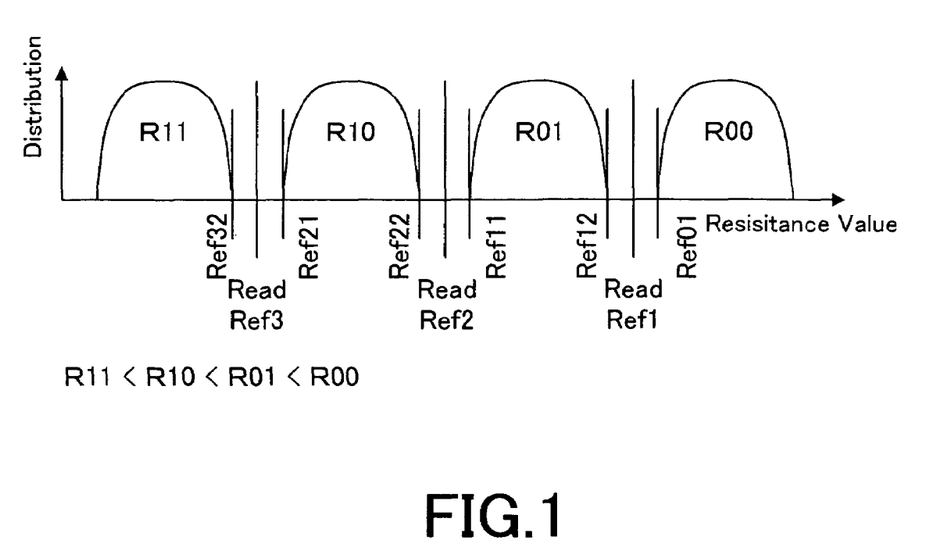
FIG. 1 is an explanatory view depicting threshold distribution of individual memory cells of a semiconductor memory device according to the invention.
Figure 4:
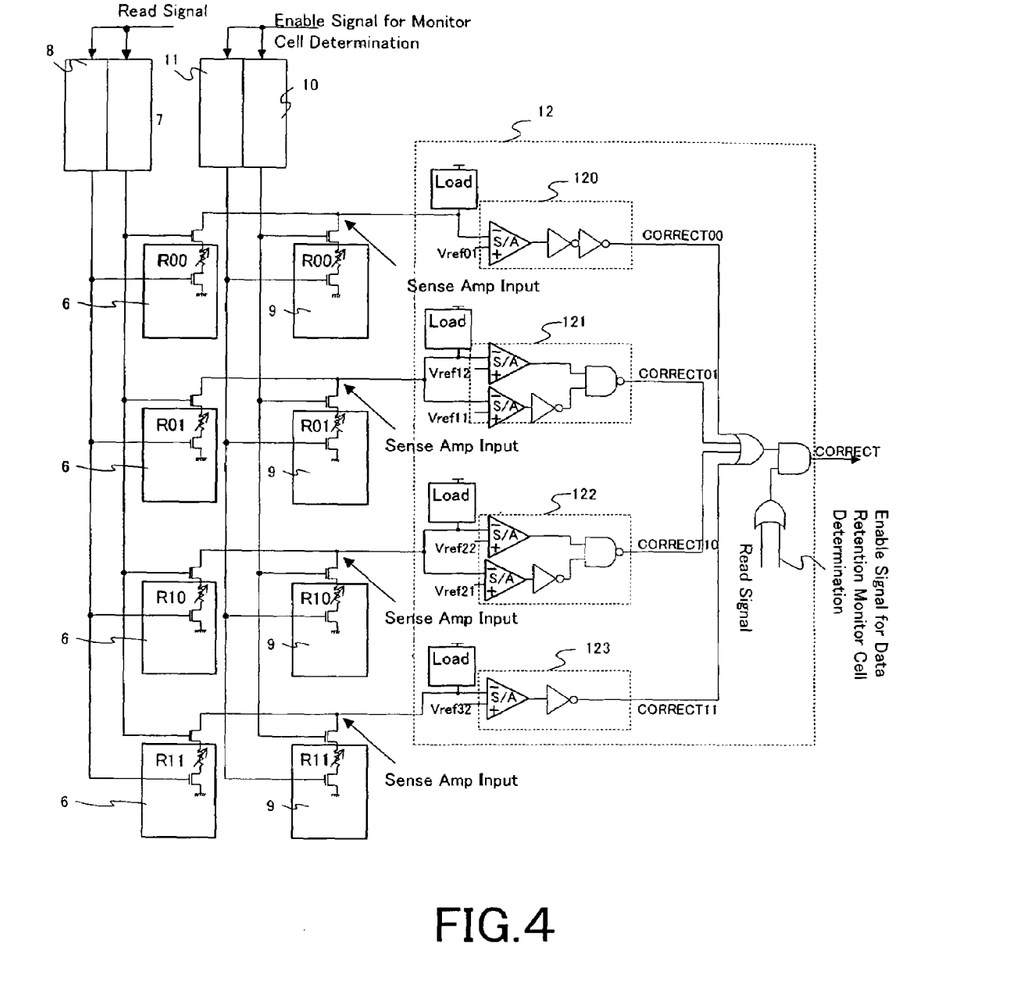
FIG. 4 is a circuit block configuration diagram of major portions of the semiconductor memory device according to the invention.

Referring now to FIG. 4, description will be made hereinbelow regarding detailed example configurations of retention monitor cells, read-disturbance monitor cells, and a monitor-cell sense circuit 12 corresponding to a memory array having the plurality of memory cells each capable of storing 4-level data and being reprogrammed. As shown in FIG. 1, in the resistance distribution states of RRAM elements, R00 is highest, R11 is lowest, and symbols Ref01, Ref11, Ref12, Ref21, Ref22, and Ref32 (which hereinbelow will be collectively referred to as "Ref01 to Ref32") denote references for setting of upper limits and lower limits of individual distribution ranges. However, since the upper limit of R00 and the lower limit of R11 need not be set, no references are present. ReadRef1, ReadRef2, and ReadRef3 individually denote references to be used in a read mode. Generally, the references are each set to an intermediate level between distributions. If the resistance value of the memory cell stays between ReadRef1 and ReadRef2, the memory cell is determined to lie in state of R01. While memory cells are held at the individual R00 to R11 states, their shifting tendencies can differ from one another. As such, to enable one cell to hold the four states, four same types of retention monitor cells and read-disturbance monitor cells need to be provided for the individual states (i.e., the four states of R11, R10, R01, and R00, shown in FIG. 1).

Referring back to FIG. 4, symbols Vref01 to Vref32 individually denote sense-amplifier reference voltages that correspond to the references Ref01 to Ref32 in FIG. 1. Since the upper limit needs not be set for R00 and the lower limit need not be set for R11, the provision of only one sense amplifier is sufficient for each of them. In the configuration thus formed, a monitor-cell determination enable signal is input to the monitor-cell sense circuit 12, the retention monitor cell column decoder 10, and the retention monitor cell row decoder 11, whereby the monitor-cell sense circuit 12 determines shifts of the resistance values of the retention monitor cells. In addition, a read signal is input to the monitor-cell sense circuit 12, the read-disturbance monitor cell column decoder 7, and the read-disturbance monitor cell row decoder 8, whereby the monitor-cell sense circuit 12 determines shifts in the read-disturbance monitor cells.

The monitor-cell sense circuit 12 includes shift determination circuits 120 to 123. The shift determination circuit 120 is configured of a sense amplifier and two inverters, and performs a comparison between a voltage read out of a retention or read-disturbance RRAM element (R00) and the sense-amplifier reference voltage Vref01. If the voltage, which has been read out of the retention or read-disturbance RRAM element (R00), is higher than the reference voltage Vref01, the shift determination circuit 120 outputs a low level "L" to CORRECT00. On the other hand, if the read out voltage (i.e., the voltage read out of the retention or read-disturbance RRAM element (R00)) is lower than the reference voltage Vref01, the shift determination circuit 120 outputs a high level "H" to CORRECT00. The shift determination circuit 121 is configured of two sense amplifiers, an inverter, and a NAND circuit. In this configuration, if a voltage read out of the retention or read-disturbance RRAM element (R01) is held between the sense-amplifier reference voltages Vref11 and Vref12, the shift determination circuit 121 outputs a low level "L" to CORRECT01. On the other hand, if the read out voltage is not held therebetween, the shift determination circuit 121 outputs a high level "H" to CORRECT01. The shift determination circuit 122 is configured of two sense amplifiers, an inverter, and a NAND circuit. In this configuration, if a voltage read out of the retention or read-disturbance RRAM element (R10) is held between the sense-amplifier reference voltages Vref21 and Vref22, the shift determination circuit 122 outputs a low level "L" to CORRECT10. On the other hand, if the read out voltage is not held therebetween, the shift determination circuit 122 outputs a high level "H" to CORRECT10. The shift determination circuit 123 is configured of a sense amplifier and an inverter. In this configuration, if a voltage read out of the retention or read-disturbance RRAM element (R11) is lower than the sense-amplifier reference voltage Vref32, the shift determination circuit 123 outputs a low level "L" to CORRECT11. On the other hand, if the read out voltage is higher than the reference voltage Vref32, the shift determination circuit 123 outputs a high level "H" to CORRECT11.

The individual signals of CORRECT00, CORRECT01, CORRECT10, and CORRECT11 (which hereinbelow will be collectively referred to as "CORRECT00 to 11") are connected to an OR circuit. The output of the OR circuit is connected to one input of an AND circuit. The other input of the AND circuit, is coupled to the output of the OR circuit which is formed of the retention monitor cell determination enable signal and the read signal. Therein, the AND circuit outputs a correction signal CORRECT. For example, when the resistance value of the retention or read-disturbance monitor cell in the state of R01 is higher than Ref12 or is lower than Ref11, CORRECT01 outputs the high level "H." After having passed through the OR logic, the output of the correction signal CORRECT, which corresponds to individual states, is input to the control engine. Even when one of the monitor cells is shifted to the state, the processing is allowed to proceed to a verification-correction algorithm of the memory array 1. This leads to enhancement of reliability.

Figure 5:
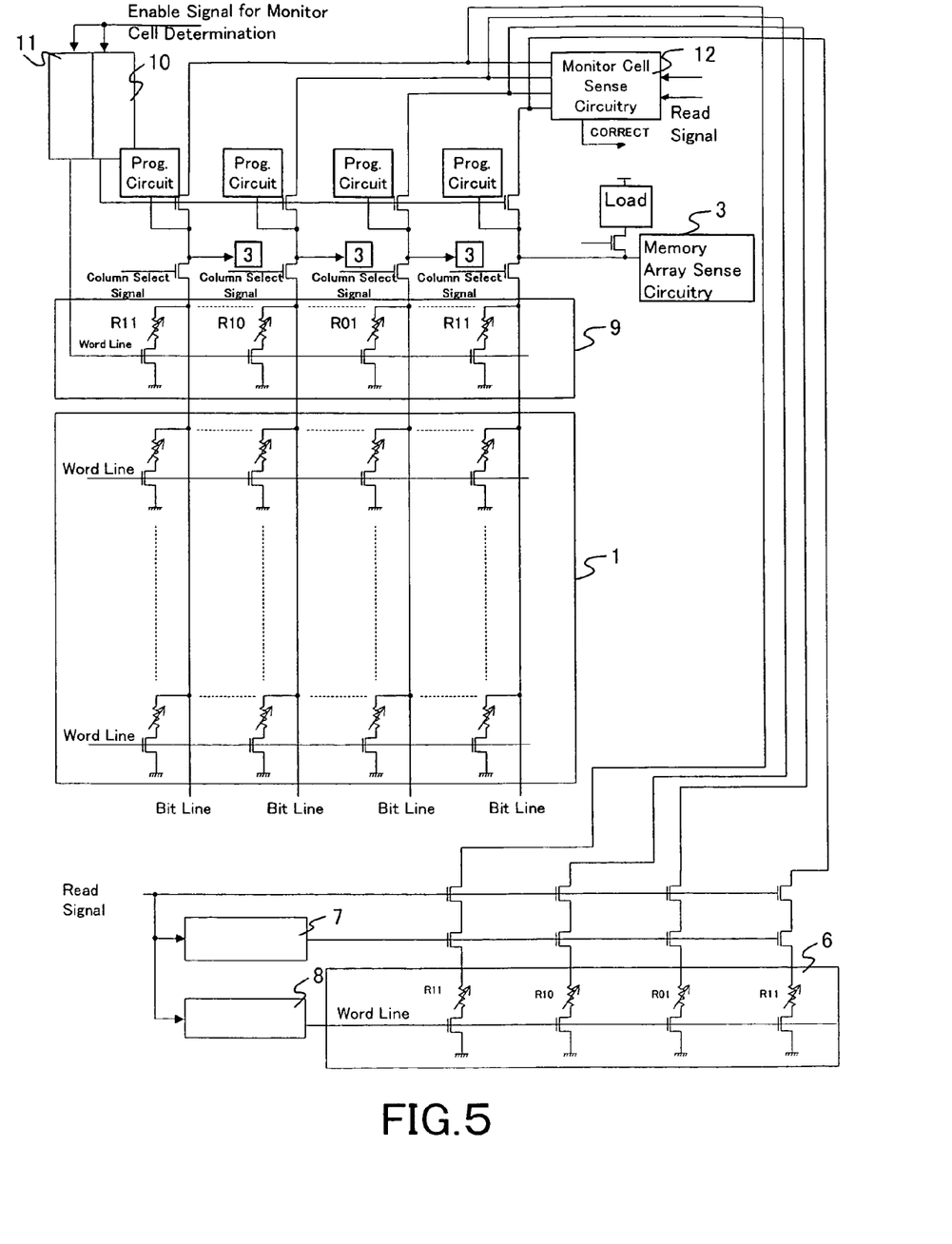
FIG. 5 is a circuit block configuration diagram of major portions of the semiconductor memory device according to the invention.

FIG. 5 shows a configuration including example arrangements of the retention monitor cell array 9 and the read-disturbance monitor cell array 6. In the configuration, the retention monitor cell array 9 is disposed on the same bit lines of the memory array 1 and between the memory array 1 and power sources (such as program circuits and read circuits), and the read-disturbance monitor cell array 6 is disposed in a different array. In more detail, the retention monitor cell array 9 is disposed between the plurality of memory cells, which are monitoring targets of the second monitor cells, and the load circuits that supply voltages requited for the read operation to the memory cells. As such, the retention monitor cell array 9 may be configured so that the distance from each of the power sources to each of the bit lines connected to the monitor cells is shorter than that in the case of the memory cell. In this case, since a bit line resistance of the retention monitor cell is lower than a bit line resistance of the memory cell, stresses occurring during program and read operation are facilitated to impose on the cell. As such, even when the memory array 1 has been selected, the retention monitor cell array receives stresses more than an unselected memory cell. This causes the monitor cell to shift easier as compared to the memory cell, consequently enabling sensing of the shift of the memory cell to early be accomplished.

The read-disturbance monitor cell, which is used to reflect the read disturbance influence, is preferably configured such that the read-operation causing stress on the read-disturbance monitor cell in its data retention state is greater than the corresponding stress on the memory cell, which is the monitoring target of the read-disturbance monitor cell. In more detail, in the configuration, each time a read operation takes place for the memory cell, which is the monitoring target of the read-disturbance monitor cell, at least one read operation is executed on the read-disturbance monitor cell.

Suppose that the retention or read-disturbance monitor cell, which receives stresses greater than the memory cell and which has an easily shiftable physical quantity (resistance value), is held in a state within the specified range. In this case, the memory cell, which is less shiftable than the retention or read-disturbance monitor cell has high probability of being held within the specified range. Thus, according to the present invention, processing first verifies whether a shift has occurred in the state of the retention or read-disturbance monitor cell. As a result, only when a shift has occurred in the retention or read-disturbance monitor cell, processing senses a shift in the memory cell and correct the state thereof. As such, according to the invention, dissimilar to the conventional case, stresses are not imposed on the memory each time a shift in the memory cell is sensed, and a sensed shift in the memory cell can early be detected, consequently enabling power consumption to be reduced.

Figure 2:
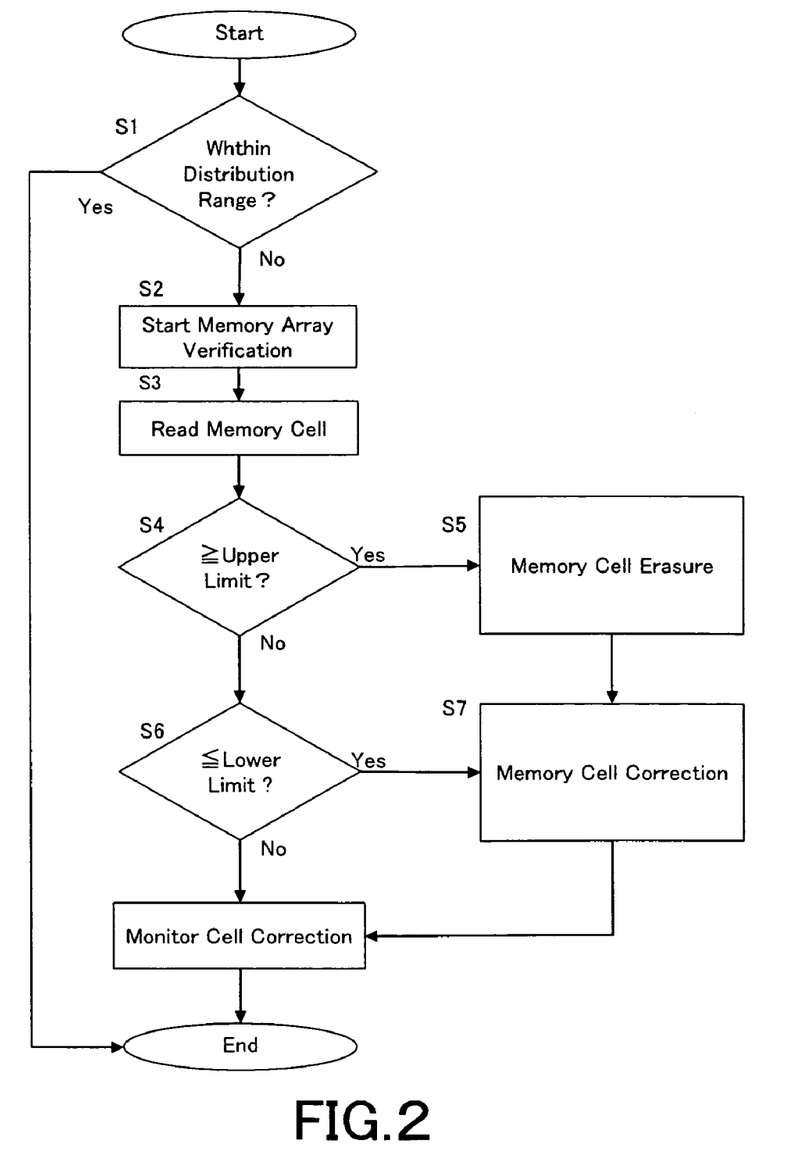
FIG. 2 is an explanatory flowchart of a correction method for correcting data stored in memory cells according to the invention.

The verification-correction algorithm to be applied for the memory cells is shown in FIG. 2. The algorithm will be described hereunder with reference to an example case. In the example case, the resistance value of the memory cell located at the first address corresponding to R01 is assumed to have shifted in the direction along which the resistance value of the memory cell increases. In more detail, the state of the cell is assumed to be held in an intermediate region between Ref12 and ReadRef1. First, at step S1 the routine of the algorithm determines whether the state of the memory cell is within the distribution range. Concurrently, in accordance with a monitor-cell determination enable signal at a predetermined frequency which has been output by the retention monitor cell sense timer circuit 13, states of the four types of retention monitor cells R00-R11, (which hereinbelow will be collectively referred to as "R00 to R11"), as shown in FIG. 1, are read out of the retention monitor cell array 9. Then, the read out states are verified by the monitor-cell sense circuit 12. In the present example case, at least one of the four types of retention monitor cells is assumed to be out of the distribution range, so that the monitor-cell sense circuit outputs a correction signal CORRECT at the high level "H." Then, to execute a verification of the memory array, the routine proceeds to step S2 in which the verification of the memory array will be commenced. Alternatively, in accordance with a read signal for read-disturbance monitor cells, states of the read-disturbance monitor cells R00 to R11 are read out of the read-disturbance monitor cell array 6, and the read out states are then verified by the monitor-cell sense circuit 12 (step S1). In the present example case, one of the four types of retention monitor cells is assumed to be between Ref12 and ReadRef1, and at least one of the four types of retention monitor cells is assumed to be out of the distribution range. Accordingly, the monitor-cell sense circuit 12 outputs a correction signal CORRECT at the high level "H." Then, the routine proceeds to step S2 to verify the memory array. If the retention monitor cell or the read-disturbance monitor cell is not within the distribution range, the routine proceeds to step S2.

The first address is input to the control engine 16, in which the first address is set and a read operation is performed to read the first address (steps S2 and S3). The read operation is the same as a regular read operation, so that ReadRef1 to ReadRef3 stored in the reference array are used as references. In the present example case, data equivalent to the state of R01 is output. Keeping the state where the data is read, the routine proceeds to step S4, in which the processing verifies whether the state of the memory cell is higher than the upper limit of the distribution range of the cell. That is, the processing of the step verifies whether the state does not exceed the upper limit of R01. In the present example case, the state is compared to Ref12; and as a result, since the state is determined higher than the upper limit, the routine proceeds to step S5, in which the memory cell is erased to be in the state of R11. Thereafter, the routine proceeds to step S7 to perform a program operation until the state of the memory cell falls within the distribution range, specifically, within the distribution range of R01.

Subsequently, a correction operation is performed for the state the retention or read-disturbance monitor cell to correct the state of the monitor cell to be within the original distribution range. The correction operation of the retention or read-disturbance monitor cell is performed in a similar manner to the correction operation (steps S4 to S7, as described above) performed for the memory cell. Since the steps described above need to be executed for all the remaining memory cells, the steps are repeatedly executed by resetting the address in step S2 until the last address is reached.

The algorithm will now be described hereunder with reference to an example case where the resistance value of the memory cell located at the first address corresponding to R01 is assumed to have shifted in the direction along which the resistance value of the memory cell decreases. In more detail, the state of the cell is assumed to be held in an intermediate region between Ref11 and ReadRef2. First, the retention monitor cell sense timer circuit 13 outputs a monitor-cell determination enable signal at a predetermined frequency. In accordance with the monitor-cell determination enable signal, states of the four types of retention monitor cells R00 to R11, as shown in FIG. 1, are read out of the retention monitor cell array 9, and the read out states are verified by the monitor-cell sense circuit 12 (step S1). In the present example case, at least one of the four types of retention monitor cells is assumed to be out of the distribution range, so that the monitor-cell sense circuit 12 outputs a correction signal CORRECT at the high level "H." Then, to execute a verification of the memory array, the routine proceeds to step S2 in which verification of the memory array will be commenced. Alternatively, in accordance with a read signal, states of the read-disturbance monitor cells R00 to R11 are read out of the read-disturbance monitor cell array 6, and the read out states are then verified by the monitor-cell sense circuit 12 (step S1). In the present example case, at least one of the four types of read-disturbance monitor cells is assumed to be out of the distribution range. Accordingly, the monitor-cell sense circuit 12 outputs a correction signal CORRECT at the high level "H." Then, the routine proceeds to step S2 to verify the memory array. When any one of the retention monitor cell and the read-disturbance monitor cell is not within the distribution range, the routine proceeds to step S2.

The first address is input to the control engine, in which the first address is set and a read operation is performed to read the first address (steps S2 and S3). The read operation is the same as a regular read operation, so that ReadRef1 to ReadRef3 stored in the reference array are used as references. In the present example case, data equivalent to the state of R01 is output. Keeping the state where the data is read, the routine proceeds to step S4, in which the processing of the step verifies whether the state of the memory cell does not exceed the upper limit of the distribution range of R01. In the present example case, the state is compared to Ref12; and as a result, the state is determined to be not higher than the upper limit. Then, the routine proceeds to step S6, in which the processing of the step verifies whether the state of the memory cell does not exceed the lower limit of R01. In the present example case, the state is compared to Ref11, and as a result, the state is determined lower than the lower limit. The routine then proceeds to step S7 to perform a program operation until the state of the memory cell falls within the distribution range of R01.

Subsequently, a correction operation is performed for the state the retention or read-disturbance monitor cell to correct the state of the monitor cell to be within the original distribution range. The correction operation of the retention or read-disturbance monitor cell is performed in a similar manner to the correction operation (steps S4 to S7) performed for the memory cell. Since the steps described above need to be executed for all the remaining memory cells, the steps are repeatedly executed by resetting the address in step S2 until the last address is reached.

Figure 6:
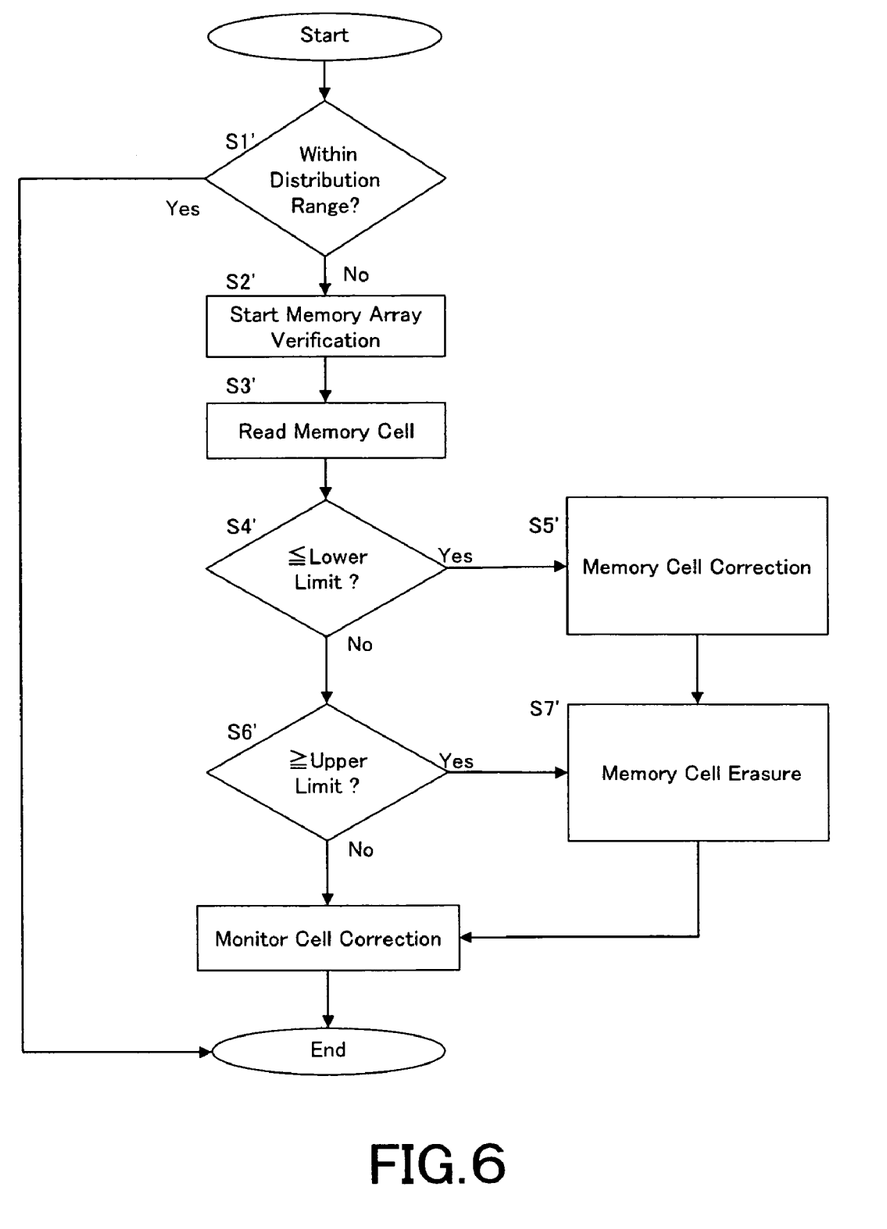
FIG. 6 is an explanatory flowchart of a correction method for correcting data stored in memory cells according to another embodiment of the invention.

The algorithm illustrated in FIG. 2 has a feature in that when reading a memory cell and sensing whether read out data has shifted, the upper limit is first sensed and the lower limit is then sensed. According to the algorithm, in the event that the state of the memory cell is not higher than the distribution range and is lower than the lower limit, the processing is performed in three steps S4→S6→S7. On the other hand, in the event that the state of the memory cell is not lower than the lower limit of the distribution range and is higher than the upper limit, the processing is performed in three steps S4→S5→S7. Thus, in either of the events, the processing is completed in the three steps. In comparison, however, as shown in FIG. 6, suppose that the sense operations are performed in the order opposite to the order in the algorithm of the embodiment; that is, the lower limit is first sensed, and the upper limit is then sensed. In this case, in the event that the state of the memory cell is not lower than the lower limit of the distribution range and is higher than the upper limit, the processing needs to be performed in four steps S4'→S6'→S7'→S5'. On the other hand, in the event that the state of the memory cell is lower than the lower limit, the processing needs to be performed in two steps S4'→S5'. Thus, the algorithm of the present embodiment enables the number of steps to be reduced smaller than the algorithm of FIG. 6 that requires the four steps for the above-described processing.

As above, the embodiment has been described with reference to the example case corresponding to the memory array having the plurality of memory cells each capable of storing 4-level data and being reprogrammed. In general, however, the present invention may be configured corresponding to a memory array having a plurality of memory cells, each of which is capable of storing N-level data (N represents a natural number of 2 or greater) and being reprogrammed.

In the embodiment described above, the correction means is provided to enable the values of the memory cells to maintain appropriate at all times. However, such correction means need not be provided in, for example, a semiconductor memory device used for trial measurement of the stress level or having production specifications declaring termination of the device service life upon verification of memory-cell abnormality. In this case, the provision of verification means for grasping the result is sufficient.

The semiconductor memory device has been described with reference to the example configured using the voltage-sensing differential amplifier circuit as the sensing means that senses whether the monitor-cell physical quantity corresponding to the data value stored in the monitor cell is within the preset range. However, the sensing means is not limited to the above-described amplifier circuit and may be appropriately configured corresponding to the sense target. For example, a current-sensing differential amplifier circuit may be used to indirectly sense the resistance value. The sensing means is not limited to the directly sensing type, but it may be of a type configured to be capable of directly or indirectly sensing whether the physical quantity is within the preset range. In addition, the factor representing the physical quantity is not limited to the resistance value. The factor may be any one of others, such as the charge amount, corresponding to the data value stored in the medium such as the memory cell and the monitor cell.

While the memory cells of the semiconductor memory device have been described with reference to the example configured using the RRAM element as the nonvolatile variable resistor element, the nonvolatile variable resistor element is not limited thereto. The memory cell may be configured using an element whose resistance is varied by an external stress, such as an MRAM (magnetic RAM) element whose resistance value is variable depending on the magnetization direction or an OUM (ovonic unified memory) element whose resistance value is variable depending on crystalline-state variations caused by heat.

As described above, according to the present invention, the monitor cell is first checked whether the state has shifted; and only when the monitor cell has shifted, the shift of the memory cell is sensed. As such, according to the invention, unlike the conventional case, memory-cell shift are not frequently sensed, and hence the memory cells are not overstressed; and shift-sensing can be efficiently and early detected. This consequently enables power consumption to be reduced.

In addition, two types of monitor cells, namely, retention and read-disturbance monitor cells, are provided, whereby causes of resistance-value shifts can be classified, and hence individual influences thereof can be identified. Further, with the retention-monitor-cell sensed timer circuit being used, verifications of retention monitor cell states at a constant frequency and verifications of read-disturbance monitor cell states at the time of data read from the memory array can be automatically implemented without the conventionally required external input. This consequently enables long-term steady operations of the semiconductor memory device to be guaranteed.

Furthermore, since the memory cells are each configured using the nonvolatile variable resistor element, correction of the resistance value can be implemented in units of the memory cell with respect to the normal distribution range of the memory cell. The correction can be implemented not only when the resistance value has increased, but also when the resistance value has decreased. Consequently, reliability can be enhanced.

Although the present invention has been described in terms of the preferred embodiment, it will be appreciated that various modifications and alterations might be made by those skilled in the art without departing from the spirit and scope of the invention. The invention should therefore be measured in terms of the claims which follow.

What is claimed is:

1. A semiconductor memory device comprising:
a plurality of memory cells, each of which is capable of storing N-level data (N represents a natural number of 2 or greater) and being reprogrammed;
a plurality of monitor cells that separately store individual data values of the N-level data by using the same scheme as that used by the memory cells;
sensing means for sensing whether a physical quantity of the monitor cell which corresponds to the data value stored in the monitor cell is within a preset range; and
verification means for verifying whether the physical quantity of the memory cell which corresponds to the data value stored in the memory cell is within the preset range when the sensing means has sensed that the physical quantity of the monitor cell is out of the preset range.

2. The semiconductor memory device according to claim 1, wherein the monitor cells include at least a first monitor cell and a second monitor cell, the first monitor cell monitoring deteriorations caused in read operations for data retention states of the memory cells, and the second monitor cell monitoring time-dependent deteriorations of the data retention states of the memory cells.

3. The semiconductor memory device according to claim 2, wherein the semiconductor memory device is configured such that stresses influencing the deteriorations of the data retention states, which stresses occur with the read operations, on the first monitor cell are greater than the stresses on the memory cells which are monitoring targets of the first monitor cell.

4. The semiconductor memory device according to claim 2, wherein the semiconductor memory device is configured such that each time a read operation takes place for the memory cell which is a monitoring target of the first monitor cell, at least one read operation is executed on the first monitor cell.

5. The semiconductor memory device according to claim 2, wherein the semiconductor memory device is configured such that stresses influencing deteriorations of data retention states on the second monitor cell in state not directly receiving a read operation, a program operation, and an erase operation is greater than the stresses on the memory cells which are monitoring targets of the second monitor cell.

6. The semiconductor memory device according to claim 2, wherein the plurality of monitor cells are disposed between the plurality of the memory cells, which are the monitoring targets of the second monitor cell, and load circuits that supply voltages required for the read operation to the memory cells.

7. The semiconductor memory device according to claim 1, further comprising a timing generation circuit that generates a synchronizing signal for the sensing means to execute sensing of the physical quantity of the monitor cell with a predetermined timing.

8. The semiconductor memory device according to claim 1, further comprising correction means for correcting the physical quantity of the memory cell to be within the preset range when the verification means has verified the physical quantity of the memory cell to be out of the preset range.

9. The semiconductor memory device according to claim 8, wherein the correction means corrects the physical quantity by executing at least programming or erasure on the memory cell which is a correction target.

10. The semiconductor memory device according to claim 1, wherein the memory cell is configured to comprise a selection transistor and a nonvolatile variable resistor element permitting electrical resistance to be varied by electrical stresses and retaining the varied electrical resistance even after the electrical stresses have been relieved.

11. The semiconductor memory device according to claim 10, wherein in the nonvolatile variable resistor element, an oxide having a perovskite structure containing manganese is formed between electrodes.

12. A correction method for correcting data stored in memory cells, each of which is capable of storing N-level data (N represents a natural number of 2 or greater) and being reprogrammed, the correction method comprising:

using a plurality of monitor cells that separately store individual data values of the N-level data by using the same scheme as that used for the memory cells;

sensing whether a physical quantity of the monitor cell which corresponds to the data value stored in the monitor cell is within a preset range;

verifying whether the physical quantity of the memory cell which corresponds to the data value stored in the memory cell is within the preset range when the sensing means has sensed that the physical quantity of the monitor cell is out of the preset range; and correcting the physical quantity of the memory cell to be within the preset range when the physical quantity of the memory cell has been verified to be out of the preset range.

13. The correction method according to claim 12, wherein the monitor cells include at least a first monitor cell or a second monitor cell, the first monitor cell monitoring deteriorations caused in read operations for data retention states of the memory cells, and the second monitor cell monitoring time-dependent deteriorations of the data retention states of the memory cells.

14. The correction method according to claim 12, wherein the step of sensing whether the physical quantity of the monitor cell is within the preset range is performed with timing based on a synchronizing signal generated by a timing generation circuit provided to generate synchronizing signals that are used to execute sensing of physical quantities of the monitor cells with predetermined timings.

15. The correction method according to claim 12, wherein the memory cell is configured to comprise a selection transistor and a nonvolatile variable resistor element permitting electrical resistance to be varied by electrical stresses and retaining the varied electrical resistance even after the electrical stresses have been relieved.

16. The correction method according to claim 15, wherein in the nonvolatile variable resistor element, an oxide having a perovskite structure containing manganese is formed between electrodes.

* * * * *